United States Patent [19]
McDougall et al.

[11] Patent Number: 5,307,016
[45] Date of Patent: Apr. 26, 1994

[54] MAGNETIC FIELD GENERATING APPARATUS

[75] Inventors: Ian L. McDougall, Charlbury; Robert C. Hawkes, Cambridge; Peter Hanley, Forest of Dean, all of Great Britain

[73] Assignee: Oxford Instruments Limited, Oxford, England

[21] Appl. No.: 850,833

[22] Filed: Mar. 13, 1992

[30] Foreign Application Priority Data

Mar. 13, 1991 [GB] United Kingdom ............... 9105286

[51] Int. Cl.$^5$ ............................................. G01R 33/20
[52] U.S. Cl. ..................................... 324/320; 324/318
[58] Field of Search ............... 324/300, 307, 309, 318, 324/322, 319, 320

[56] References Cited

U.S. PATENT DOCUMENTS

| | | | |
|---|---|---|---|
| 4,689,591 | 8/1987 | McDougall | 324/319 |
| 4,728,895 | 3/1988 | Briguet et al. | |
| 4,771,243 | 9/1988 | Vreugdenhil et al. | 324/320 |
| 4,788,502 | 11/1988 | Keller et al. | 324/318 |
| 4,926,111 | 5/1990 | Lungu | |
| 5,012,192 | 4/1991 | Siebold | 324/318 |

FOREIGN PATENT DOCUMENTS

| | | |
|---|---|---|
| 0134701 | 3/1985 | European Pat. Off. |
| 0187691 | 7/1986 | European Pat. Off. |
| 0304126 | 2/1989 | European Pat. Off. |
| 0372096 | 6/1990 | European Pat. Off. |
| 0404461 | 12/1990 | European Pat. Off. |

OTHER PUBLICATIONS

Journal of Physics E. Scientific Instruments, vol. 22, No. 8, Aug. 22, 1989, Bristol GB, pp. 565-573, B. H. Suits et al., *Improving Magnetic Field Gradient Coils for NMR Imaging*.

*Primary Examiner*—Michael J. Tokar

[57] ABSTRACT

Magnetic field generating apparatus having a solenoid arranged to generate a steady magnetic field gradient along its axis. The arrangement is such that in use contours of constant field are formed within the solenoid. The contours extend generally radially outwardly from the axis of the solenoid and asymmetrically with respect to the center plane of the solenoid orthogonal to its axis. Regions of substantially homogeneous magnetic field suitable for performing an NMR experiment exist about each contour, the regions having substantially constant thickness along the contours.

3 Claims, 5 Drawing Sheets

$\Delta A = A_2 - A_1$
$AA = (A_2 + A_1)/2$ $\Delta B = B_2 - B_1$
$BA = (B_2 + B_1)/2$

MAGNETIC FIELD GENERATING APPARATUS

BACKGROUND OF THE INVENTION

1. Field of the Invention

The invention relates to magnetic field generating apparatus particularly for use in performing a nuclear magnetic resonance (NMR) experiment.

2. Description of the Prior Art

NMR experiments rely on placing a sample to be examined in a controlled magnetic field, generally having a high homogeneity. MRI magnets have been designed to produce spherical zones of homogeneity by cancelling between axial coil arrays low error order terms, say Z2 and Z4, and as many higher order terms as permitted by cost constraints. It is well known that an array of n axial coils will correct up to 2n axial even orders—ie. a four coil magnet corrects $Z_2$, $Z_4$, $Z_6$ (there are always considered an even number of coils symmetrically placed about the midplane of the magnet). The diameter of the homogeneous zone increases as higher orders are cancelled, but it becomes more costly to do this as more coils are needed. Now it happens, that the higher order terms contribute to the net field at a radial point more strongly as the radius of the homogeneous zone increases. Another way of looking at this is to say that as the considered field point is moved out in radius, closer to the inner radius of the coils, the local field contribution of the nearest coil dominates the situation, increasing the rate of field charge with radius. Therefore, it is usual to accept that MRI magnets, comprised of a few discrete coils are designed to produce ussable homogeneity over, perhaps half of their bore diameter. It is too costly to correct a large number of high orders by discrete arrays. As the maximum diameter of the object subjected to NMR is increased, the magnet bore size has to be increased such that the magnet bore diameter is twice the maximum subject diameter.

Increasing the diameter of the coil set is costly in superconductor. The following simple analysis shows that for fixed field and conductor hoop stress, cost rises in proportion to the radius cubed.

$V = 2\pi a$ A n, a=coil radius, A=coil cross-section, n=nos turns

Stress in a turn $\sigma = I*Bz*a/A$. I=current, Bz is local axial field $\sigma = I*a*Bo/A$, Bo-Bz where Bo is the bore field $Bo = \mu o*n*I/a$, for a simple coil Substituting for I
$Cost = (2\pi/\mu)*a^3*Bo^2/\sigma$ Conventional MRI magnets are not satisfactory, therefore, for examining relatively large objects where the areas of interest extend beyond the region which can be placed within the spherical homogeneous region even though the object can be placed within the coils.

SUMMARY OF THE INVENTION

In accordance with the present invention, magnetic field generating apparatus comprises a solenoid arranged to generate a steady magnetic field gradient along the axis of the solenoid, the arrangement being such that in use contours of constant field are formed within the solenoid extending generally radially outwardly from the axis of the solenoid, asymmetrically with respect to the center plane of the solenoid orthogonal to its axis, wherein regions of substantially homogeneous magnetic field suitable for performing an NMR experiment exist about each contour, the regions having substantially constant thickness along the contours.

We have realised that if an odd order gradient is applied to a solenoid, the spherical central region which is normally present at the center of a solenoid suitable for NMR is largely removed and a set of saucer shaped high homogeneity planes are generated, there being a gradient between the planes, that extends to the diameter of the solenoid. We are then able to illuminate a subject of given diameter with a coil set of approximately the same diameter, and benefit from, the $r^3$ cost savings. In Table 1 below conductor quantity for 2.0TO, 70 MPa MRI magnets, spherical homogeneity is compared with a solenoid of similar length, planar homogeneity, where both are able to illuminate a subject 0.8 m diameter.

TABLE 1

| Comparison of a solenoid for planar homogeneous zones and a "standard" MRI magnet Comparison at 2.0T 70 MPa hoop stress: | |
|---|---|
| "MRI array 6 coil" | |
| Mean coil radius 80 cm | |
| Mean overall length 246 cm | |
| Homogeneous sphere ± 100 ppm | 80 cm |
| Conductor at 100T cm$^{-2}$ | 515554 m |
| Gradient Solenoid | |
| Mean coil radius 40 cm | |
| Mean overall length 400 cm | |
| Homogeneous sphere ± 100 ppm | 80 cm |
| Conductor at 100T cm$^{-2}$ | 122447 m |

A further significant advantage of this apparatus is that the working regions will extend substantially fully across the diameter of the solenoid. Consequently, much larger areas of the sample can be investigated than has previously been possible. For example, inanimate objects such as polymer composites and the like can be investigated.

The gradient field also breaks the symmetry which would otherwise exist on either side of the mid-plane of the solenoid so as to remove further spatial ambiguity.

In contrast to conventional magnets used in NMR in which the low order field terms are balanced, in the present invention a solenoid with a relatively large aspect ratio can be used which will enable higher order error terms to be balanced with the low order error terms remaining to define the axial gradient.

The invention thus envisages the use of low order axial gradients (particularly first order) which are normally eliminated in NMR magnets. It should also be noted that solenoids of practical dimensions, which will possess a positive second order axial gradient can be used. This second order governs the shape of the homogeneous regions but in "pure form" simply dishes the homogeneous regions, while a first order gradient controls the thickness of the homogeneous regions. Preferably, therefore the first order gradient is greater than or equal to the second order gradient.

The invention provides an additional advantage, when considering solid state NMR, which is that the gradient between planar homogeneous zones ensures that it is easier to provide an appropriate RF field. That is an RF field that is orthogonal to the field of the magnet everwhere in the homogeneous zone and follows the same value everywhere in space as a function of time for any pulse sequence.

BRIEF DESCRIPTION OF THE DRAWINGS

An example of magnetic field generating apparatus according to the present invention will now be described according to the accompanying drawings, in which:

FIG. 3A-FIG. 3J illustrate the effect of different $Z_1$ and $Z_2$ gradients on the homogenous regions;

DESCRIPTION OF THE PREFERRED EMBODIMENT

Figure 1:
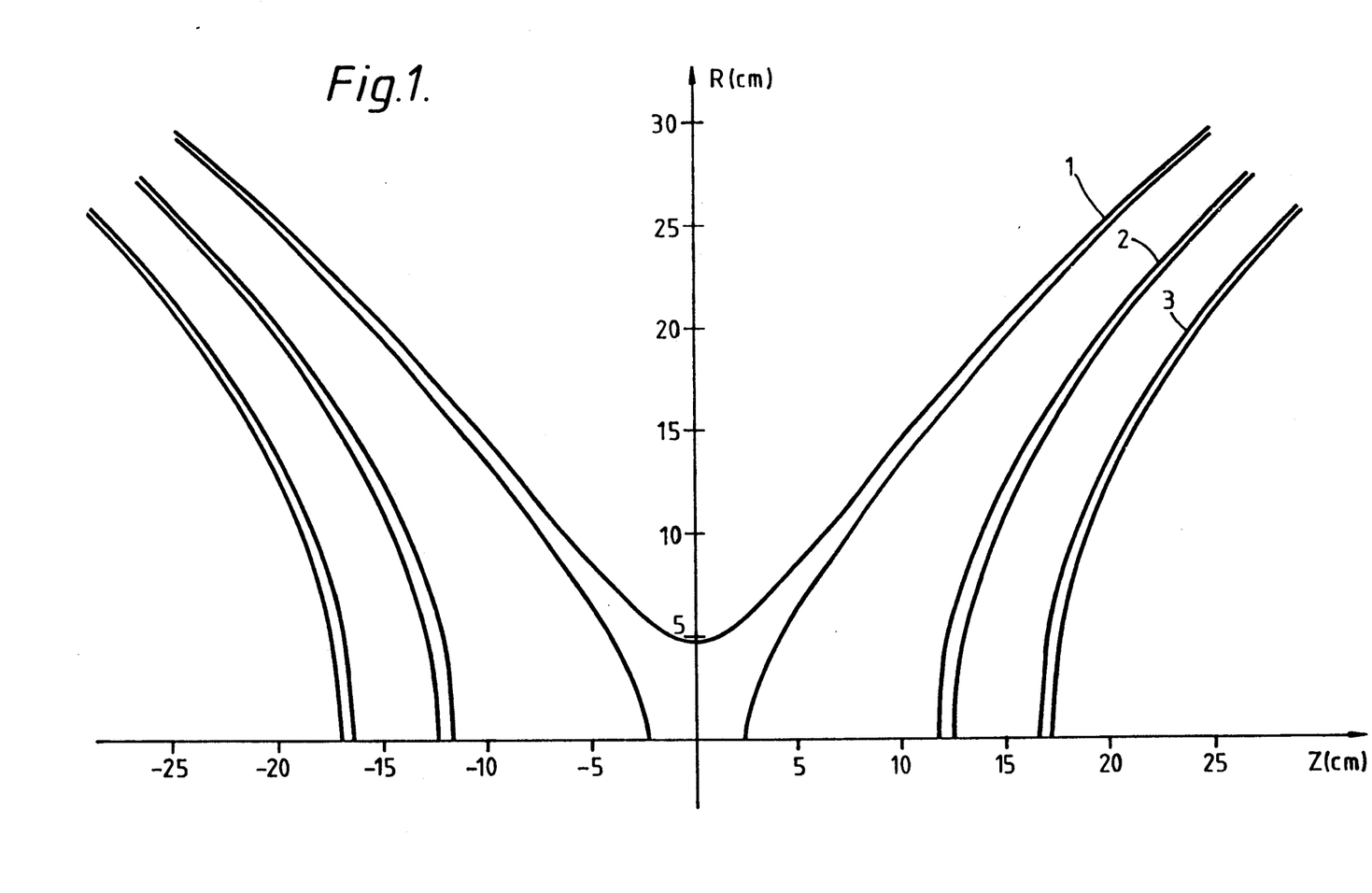
Figure 1 illustrates the field profile within a conventional solenoid.

FIG. 1 illustrates contours of constant field which exist in a simple solenoid. The plot is of radius R in cm against axial length Z in cm from mid plane or origin of magnet. The dimensions of the solenoid whose field is illustrated are inner radius=30 cm, outer radius=31.72 cm, length to the mid plane=75 cm and current density =10,050 A/cm². In this Figure, the contours are shown at three different field values separated by IOU gauss (2000, 19900 and 19800 Gauss 1, 2, 3). The thicknesses of regions of homogeneity centered at ±10 gauss from the nominal value are shown. These regions are generally deeply dished and because of the symmetry about the mid-plane, together with the central spherical region of field homogeneity, the central sections of the regions are thickened and merge with their partners in symmetry. This is unsatisfactory if attempts are made to use the dish shaped regions by reason of ambiguity due to the symmetry, the extreme curvature of the working regions, and also their varying thicknesses.

Figure 2:
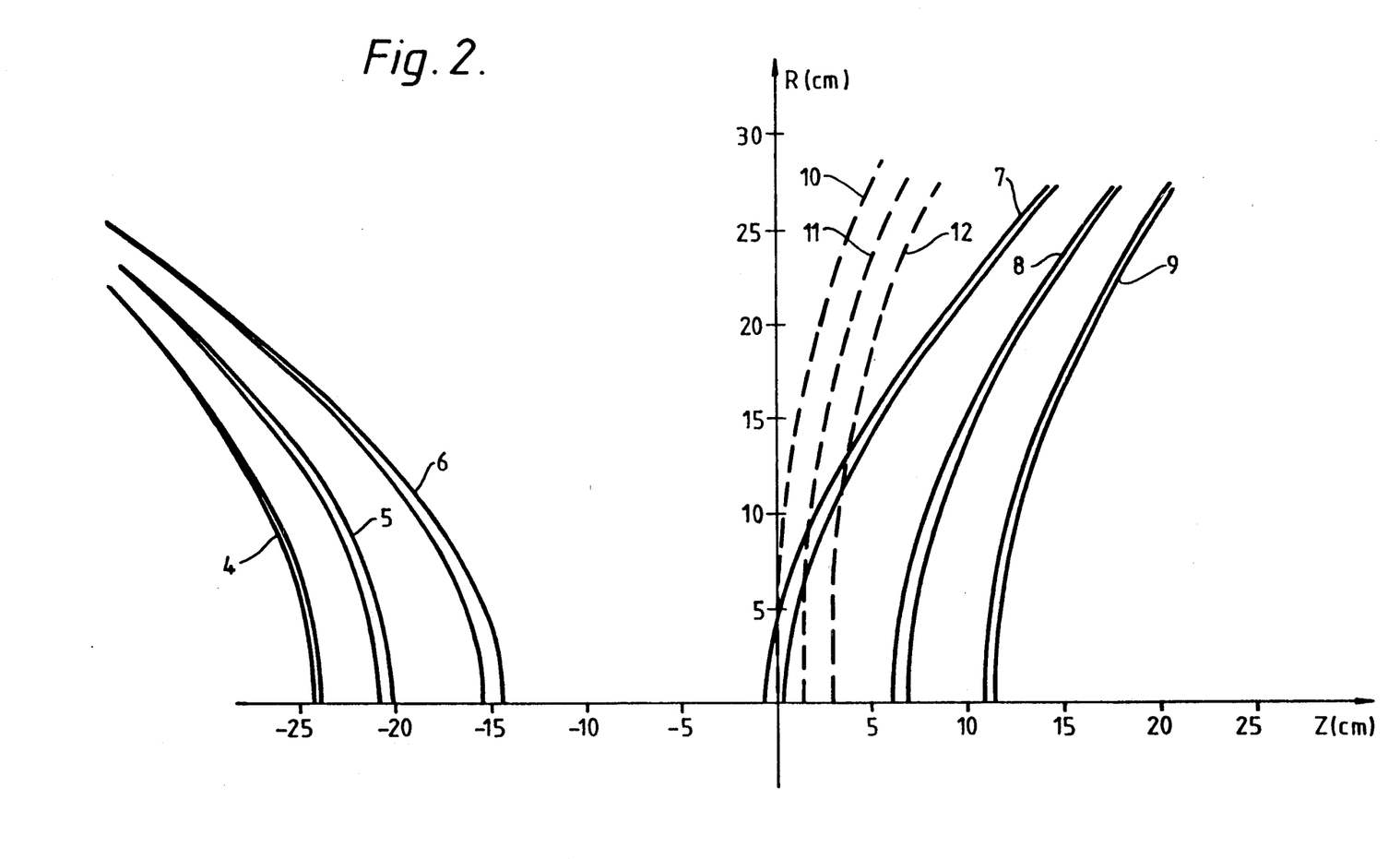
FIG. 2 illustrates the field profile within the same solenoid but modified by the addition of a gradient magnetic field generator in accordance with the invention.
Figure 3A:
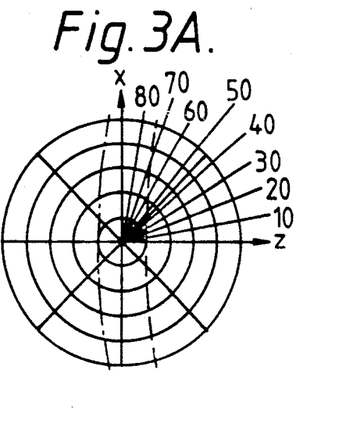
Figure 3B:
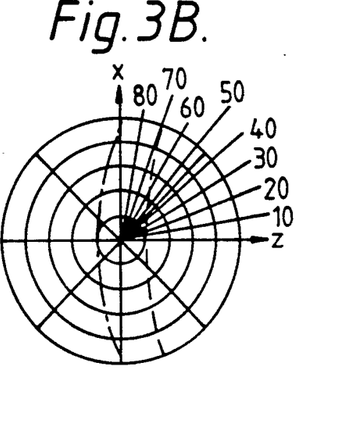
Figure 3C:
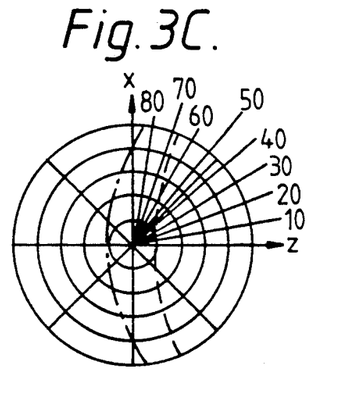
Figure 3D:
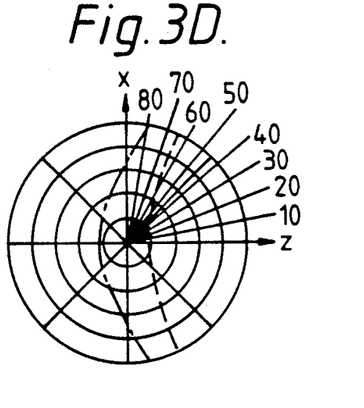
Figure 3E:
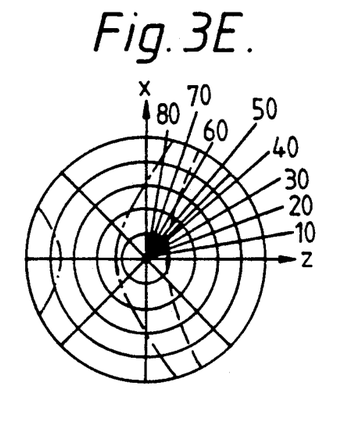
Figure 3F:
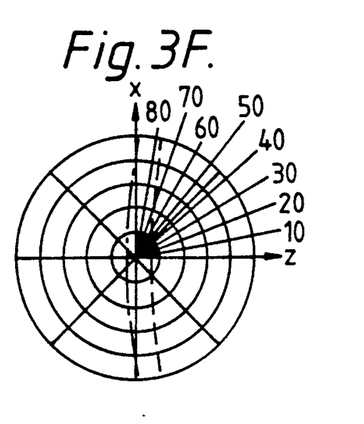
Figure 3G:
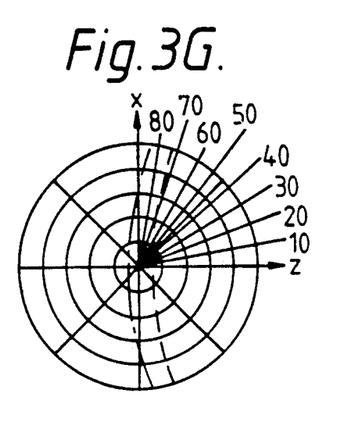
Figure 3H:
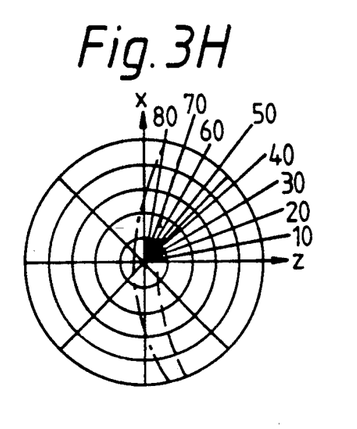
Figure 3I:
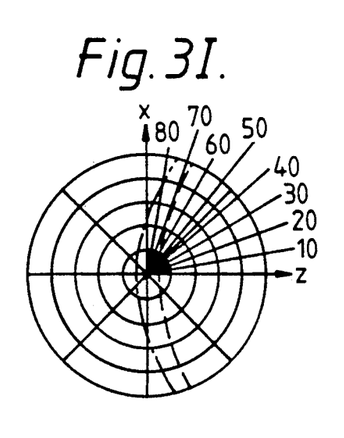
Figure 3J:
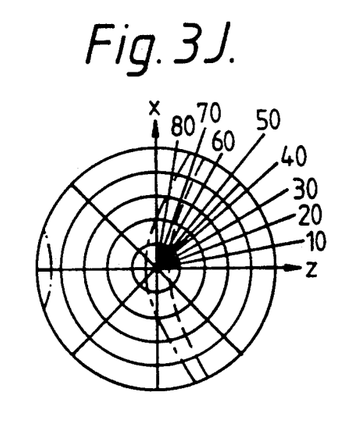

FIG. 2 illustrates the effect of modifying the solenoid so that at least the first order terms are not balanced and a steady linear, axial field gradient is generated. Firstly, the symmetry between the regions on either side of the mid-plane is removed. Secondly, the thickness of the working regions becomes determined more by the gradient and less by the properties of the solenoid. This is shown in FIG. 2 in the case of applying a gradient of 10 gauss/cm for 19800, 19900, 20000 Gauss 4,9;5;8;6,7. It can be seen also that the gradient has a beneficial effect on the flatness of the working regions which have substantially constant thicknesses and extend close to the inner circumference of the solenoid. Lines 10,11,12 illustrate the results for application of a gradient of 60 Gauss/cm for 19800, 19900 and 20000 Gauss.

A gradient will exist in the axial direction so that when an NMR experiment is performed, it is necessary dynamically to cancel that gradient but this can be done using conventional NMR techniques.

Tables 2 and 3 below set out the coil configurations used to achieve the field profiles shown in FIGS. 1 and 2, respectively. In these Tables, a1 and a2 are the internal and external radii of the solenoid, respectively while b1 and b2 are the positions of the ends of the solenoid relative to the mid-plane.

TABLE 2

| Simple solenoid - contours | |
|---|---|
| Coil # or 0 | 1.000E + 000 |
| J (A/cm2) | 1.001E + 004 |
| a1 (cm) | 3.000E + 001 |
| a2 | 3.172E + 001 |
| b1 | −7.500E + 001 |
| b2 | 7.500E + 001 |
| precision | 5.000E + 001 |

| R | Z | dB/dZ | error |
|---|---|---|---|
| Z 0.000E + 000 | | | |
| 4.700E + 000 | 0.000E + 000 | 0.000E + 000 | 2.001E + 004 |
| 7.200E + 000 | 3.892E + 000 | −4.994E + 000 | 5.858E − 007 |
| 7.900E + 000 | 6.096E + 000 | −7.705E + 000 | 2.929E − 007 |
| 1.220E + 001 | 8.167E + 000 | −1.010E + 001 | 6.834E − 007 |
| 1.470E + 001 | 1.023E + 001 | −1.230E + 001 | 6.834E − 007 |
| 1.720E + 001 | 1.233E + 001 | −1.434E + 001 | 7.810E − 007 |
| 1.970E + 001 | 1.451E + 001 | −1.620E + 001 | 6.834E − 007 |
| 2.220E + 001 | 1.680E + 001 | −1.789E + 001 | 5.858E − 007 |
| 2.470E + 001 | 1.923E + 001 | −1.936E + 001 | 2.929E − 007 |
| 2.720E + 001 | 2.185E + 001 | −2.059E + 001 | 1.953E − 007 |
| 2.970E + 001 | 2.470E + 001 | −2.150E + 001 | 9.763E − 007 |
| Z 2.200E + 000 | | | |
| 0.000E + 000 | 2.200E + 000 | −2.918E + 000 | 1.999E + 004 |
| 2.500E + 000 | 2.823E + 000 | −3.731E + 000 | 3.907E − 007 |
| 5.000E + 000 | 4.180E + 000 | −5.477E + 000 | 5.861E − 007 |
| 7.500E + 000 | 5.797E + 000 | −7.495E + 000 | 6.838E − 007 |
| 1.000E + 001 | 7.536E + 000 | −9.573E + 000 | 7.815E − 007 |
| 1.250E + 001 | 9.364E + 000 | −1.162E + 001 | 1.172E − 006 |
| 1.500E + 001 | 1.128E + 001 | −1.360E + 001 | 1.270E − 006 |
| 1.750E + 001 | 1.328E + 001 | −1.547E + 001 | 1.074E − 006 |
| 2.000E + 001 | 1.540E + 001 | −1.721E + 001 | 8.791E − 007 |
| 2.250E + 001 | 1.765E + 001 | −1.879E + 001 | 6.838E − 007 |
| 2.500E + 001 | 2.006E + 001 | −2.016E + 001 | 0.000E + 000 |
| 2.750E + 001 | 2.267E + 001 | −2.129E + 001 | 4.884E − 007 |
| 3.000E + 001 | 0.000E + 000 | 0.000E + 000 | 0.000E + 000 |
| Z 1.170E + 001 | | | |
| 0.000E + 000 | 1.170E + 001 | −1.631E + 001 | 1.991E + 004 |
| 2.500E + 000 | 1.185E + 001 | −1.647E + 001 | 0.000E + 000 |
| 5.000E + 000 | 1.228E + 001 | −1.695E + 001 | 6.868E − 007 |
| 7.500E + 000 | 1.299E + 001 | −1.769E + 001 | 1.177E − 006 |
| 1.000E + 001 | 1.394E + 001 | −1.864E + 001 | 1.668E − 006 |
| 1.250E + 001 | 1.511E + 001 | −1.974E + 001 | 2.257E − 006 |
| 1.500E + 001 | 1.649E + 001 | −2.092E + 001 | 2.159E − 006 |
| 1.750E + 001 | 1.806E + 001 | −2.212E + 001 | 2.159E − 006 |
| 2.000E + 001 | 1.983E + 001 | −2.329E + 001 | 1.864E − 006 |
| 2.250E + 001 | 2.180E + 001 | −2.435E + 001 | 1.472E − 006 |
| 2.500E + 001 | 2.400E + 001 | −2.527E + 001 | 1.079E − 006 |
| 2.750E + 001 | 2.646E + 001 | −2.595E + 001 | 1.962E − 007 |
| 3.000E + 001 | 0.000E + 000 | 0.000E + 000 | 0.000E + 000 |
| Z 1.240E + 001 | | | |
| 0.000E + 000 | 1.240E + 001 | −1.740E + 001 | 1.989E + 004 |
| 2.500E + 000 | 1.254E + 001 | −1.755E + 001 | 2.945E − 007 |
| 5.000E + 000 | 1.296E + 001 | −1.799E + 001 | 8.836E − 007 |
| 7.500E + 000 | 1.363E + 001 | −1.869E + 001 | 1.375E − 006 |
| 1.000E + 001 | 1.455E + 001 | −1.959E + 001 | 1.571E − 006 |
| 1.250E + 001 | 1.569E + 001 | −2.064E + 001 | 2.258E − 006 |
| 1.500E + 001 | 1.704E + 001 | −2.176E + 001 | 2.258E − 006 |
| 1.750E + 001 | 1.858E + 001 | −2.291E + 001 | 2.258E − 006 |
| 2.000E + 001 | 2.033E + 001 | −2.402E + 001 | 2.258E − 006 |
| 2.250E + 001 | 2.228E + 001 | −2.504E + 001 | 1.669E − 006 |
| 2.500E + 001 | 2.446E + 001 | −2.590E + 001 | 9.818E − 007 |
| 2.750E + 001 | 2.691E + 001 | −2.653E + 001 | 2.945E − 007 |
| 3.000E + 001 | 0.000E + 000 | 0.000E + 000 | 0.000E + 000 |
| Z 1.660E + 001 | | | |
| 0.000E + 000 | 1.660E + 001 | −2.439E + 001 | 1.981E + 004 |
| 2.500E + 000 | 1.671E + 001 | −2.449E + 001 | 4.931E − 007 |
| 5.000E + 000 | 1.706E + 001 | −2.480E + 001 | 1.183E − 006 |
| 7.500E + 000 | 1.762E + 001 | −2.530E + 001 | 1.381E − 006 |
| 1.000E + 001 | 1.840E + 001 | −2.594E + 001 | 2.268E − 006 |
| 1.250E + 001 | 1.939E + 001 | −2.670E + 001 | 2.663E − 006 |
| 1.500E + 001 | 2.059E + 001 | −2.753E + 001 | 2.958E − 006 |
| 1.750E + 001 | 2.199E + 001 | −2.838E + 001 | 2.958E − 006 |
| 2.000E + 001 | 2.361E + 001 | −2.919E + 001 | 2.860E − 006 |
| 2.250E + 001 | 2.546E + 001 | −2.990E + 001 | 2.465E − 006 |
| 2.500E + 001 | 2.755E + 001 | −3.045E + 001 | 1.479E − 006 |
| 2.750E + 001 | 2.995E + 001 | −3.073E + 001 | 5.917E − 007 |
| 3.000E + 001 | 0.000E + 000 | 0.000E + 000 | 0.000E + 000 |
| Z 1.710E + 001 | | | |
| 0.000E + 000 | 1.710E + 001 | −2.528E + 001 | 1.979E + 004 |

TABLE 2-continued

| | | | |
|---|---|---|---|
| 2.500E + 000 | 1.721E + 001 | −2.538E + 001 | 4.934E − 007 |
| 5.000E + 000 | 1.755E + 001 | −2.568E + 001 | 1.184E − 006 |
| 7.500E + 000 | 1.810E + 001 | −2.616E + 001 | 1.677E − 006 |
| 1.000E + 001 | 1.887E + 001 | −2.678E + 001 | 2.368E − 006 |
| 1.250E + 001 | 1.985E + 001 | −2.751E + 001 | 2.566E − 006 |
| 1.500E + 001 | 2.103E + 001 | −2.831E + 001 | 2.862E − 006 |
| 1.750E + 001 | 2.242E + 001 | −2.912E + 001 | 2.960E − 006 |
| 2.000E + 001 | 2.403E + 001 | −2.989E + 001 | 2.862E − 006 |
| 2.250E + 001 | 2.586E + 001 | −3.057E + 001 | 2.269E − 006 |
| 2.500E + 001 | 2.796E + 001 | −3.107E + 001 | 1.776E − 006 |
| 2.750E + 001 | 3.035E + 001 | −3.131E + 001 | 5.920E − 007 |
| 3.000E + 001 | 0.000E + 000 | 0.000E + 000 | 0.000E + 000 |

TABLE 3

Solenoid with 10 gauss/cm gradient - contours

| | |
|---|---|
| Coil # or 0 | 1.000E + 000 |
| J (A/cm2) | 1.001E + 004 |
| a1 (cm) | 3.000E + 001 |
| a2 | 3.172E + 001 |
| b1 | −7.500E + 001 |
| b2 | 7.500E + 001 |
| precision | 5.000E + 001 |
| Coil # or 0 | 2.000E + 000 |
| J (A/cm2) | 1.000E + 003 |
| a1 (cm) | 3.300E + 001 |
| a2 | 3.700E + 001 |
| b1 | −3.200E + 001 |
| b2 | −2.800E + 001 |
| precision | 5.000E + 001 |
| Coil # or 0 | 3.000E + 000 |
| J (A/cm2) | −1.000E + 003 |
| a1 (cm) | 3.300E + 001 |
| a2 | 3.700E + 001 |
| b1 | 2.800E + 001 |
| b2 | 3.200E + 001 |
| precision | 5.000E + 001 |

| R | Z | dB/dZ | error |
|---|---|---|---|
| \multicolumn{4}{l}{Z −2.430E + 001} | | | |
| 0.000E + 000 | −2.430E + 001 | 3.469E + 001 | 1.979E + 004 |
| 2.500E + 000 | −2.444E + 001 | 3.489E + 001 | 8.882E − 007 |
| 5.000E + 000 | −2.485E + 001 | 3.546E + 001 | 3.059E − 006 |
| 7.500E + 000 | −2.555E + 001 | 3.645E + 001 | 5.033E − 006 |
| 1.000E + 001 | −2.652E + 001 | 3.792E + 001 | 6.908E − 006 |
| 1.250E + 001 | −2.779E + 001 | 4.003E + 001 | 8.487E − 006 |
| 1.500E + 001 | −2.933E + 001 | 4.314E + 001 | 8.290E − 006 |
| 1.750E + 001 | −3.114E + 001 | 4.793E + 001 | 5.329E − 006 |
| 2.000E + 001 | −3.312E + 001 | 5.535E + 001 | 3.651E − 006 |
| 2.250E + 001 | −3.513E + 001 | 6.538E + 001 | 2.359E − 005 |
| 2.500E + 001 | −3.698E + 001 | 7.436E + 001 | 5.053E − 005 |
| 2.750E + 001 | −3.856E + 001 | 7.613E + 001 | 1.303E − 005 |
| Z −2.390E + 001 | | | |
| 0.000E + 000 | −2.390E + 001 | 3.349E + 001 | 1.981E + 004 |
| 2.500E + 000 | −2.404E + 001 | 3.369E + 001 | 1.085E − 006 |
| 5.000E + 000 | −2.446E + 001 | 3.426E + 001 | 3.057E − 006 |
| 7.500E + 000 | −2.517E + 001 | 3.525E + 001 | 4.931E − 006 |
| 1.000E + 001 | −2.616E + 001 | 3.671E + 001 | 6.903E − 006 |
| 1.250E + 001 | −2.744E + 001 | 3.880E + 001 | 8.481E − 006 |
| 1.500E + 001 | −2.901E + 001 | 4.187E + 001 | 8.974E − 006 |
| 1.750E + 001 | −3.085E + 001 | 4.664E + 001 | 6.213E − 006 |
| 2.000E + 001 | −3.287E + 001 | 5.415E + 001 | 2.465E − 006 |
| 2.250E + 001 | −3.492E + 001 | 6.454E + 001 | 2.199E + 005 |
| 2.500E + 001 | −3.679E + 001 | 7.417E + 001 | 5.237E − 005 |
| 2.750E + 001 | −3.838E + 001 | 7.653E + 001 | 1.874E − 005 |
| Z −2.080E + 001 | | | |
| 0.000E + 000 | −2.080E + 001 | 2.490E + 001 | 1.989E + 004 |
| 2.500E + 000 | −2.096E + 001 | 2.511E + 001 | 1.080E − 006 |
| 5.000E + 000 | −2.145E + 001 | 2.572E + 001 | 3.436E − 006 |
| 7.500E + 000 | −2.225E + 001 | 2.674E + 001 | 5.596E − 006 |
| 1.000E + 001 | −2.338E + 001 | 2.817E + 001 | 7.657E − 006 |
| 1.250E + 001 | −2.483E + 001 | 3.012E + 001 | 9.523E − 006 |
| 1.500E + 001 | −2.661E + 001 | 3.289E + 001 | 1.021E − 005 |
| 1.750E + 001 | −2.872E + 001 | 3.725E + 001 | 8.246E − 006 |
| 4.000E + 001 | −3.106E + 001 | 4.488E + 001 | 2.552E − 006 |
| 2.250E + 001 | −3.343E + 001 | 5.757E + 001 | 4.614E − 006 |
| 2.500E + 001 | −3.555E + 001 | 7.239E + 001 | 4.850E − 005 |
| 2.750E + 001 | −3.723E + 001 | 7.952E + 001 | 6.803E − 005 |
| Z −2.030E + 001 | | | |
| 0.000E + 000 | −2.030E + 001 | 2.363E + 001 | 1.991E + 004 |

TABLE 3-continued

| | | | |
|---|---|---|---|
| 2.500E + 000 | −2.047E + 001 | 2.385E + 001 | 1.177E − 006 |
| 5.000E + 000 | −2.096E + 001 | 2.447E + 001 | 3.238E − 006 |
| 7.500E + 000 | −2.179E + 001 | 2.550E + 001 | 5.396E − 006 |
| 1.000E + 001 | −2.294E + 001 | 2.694E + 001 | 7.457E − 006 |
| 1.250E + 001 | −2.442E + 001 | 2.887E + 001 | 9.615E + 006 |
| 1.500E + 001 | −2.624E + 001 | 3.159E + 001 | 1.001E − 005 |
| 1.750E + 001 | −2.839E + 001 | 3.587E + 001 | 7.751E − 006 |
| 2.000E + 001 | −3.079E + 001 | 4.344E + 001 | 2.158E − 006 |
| 2.250E + 001 | −3.321E + 001 | 5.638E + 001 | 2.649E − 006 |
| 2.500E + 001 | −3.537E + 001 | 7.204E + 001 | 4.513E − 005 |
| 2.750E + 001 | −3.708E + 001 | 7.997E + 001 | 7.574E − 005 |
| Z −1.540E + 001 | | | |
| 0.000E + 000 | −1.540E + 001 | 1.276E + 001 | 1.999E + 004 |
| 2.500E + 000 | −1.564E + 001 | 1.308E + 001 | 9.768E − 007 |
| 5.000E + 000 | −1.633E + 001 | 1.396E + 001 | 3.224E − 006 |
| 7.500E + 000 | −1.744E + 001 | 1.532E + 001 | 4.982E − 006 |
| 1.000E + 001 | −1.892E + 001 | 1.704E + 001 | 6.154E − 006 |
| 1.250E + 001 | −2.074E + 001 | 1.906E + 001 | 6.935E − 006 |
| 1.500E + 001 | −2.294E + 001 | 2.149E + 001 | 5.373E − 006 |
| 1.750E + 001 | −2.555E + 001 | 2.488E + 001 | 3.517E − 006 |
| 2.000E + 001 | −2.852E + 001 | 3.120E + 001 | 2.794E − 005 |
| 2.250E + 001 | −3.151E + 001 | 4.504E + 001 | 1.993E − 005 |
| 2.500E + 001 | −3.406E + 001 | 6.772E + 001 | 8.010E − 006 |
| 2.750E + 001 | −3.600E + 001 | 8.384E + 001 | 1.261E − 004 |
| Z −1.450E + 001 | | | |
| 0.000E + 000 | −1.450E + 001 | 1.104E + 001 | 2.001E + 004 |
| 2.500E + 000 | −1.476E + 001 | 1.104E + 001 | 1.269E − 006 |
| 5.000E + 000 | −1.552E + 001 | 1.237E + 001 | 3.319E − 006 |
| 7.500E + 000 | −1.671E + 001 | 1.384E + 001 | 4.784E − 006 |
| 1.000E + 001 | −1.827E + 001 | 1.565E + 001 | 5.858E − 006 |
| 1.250E + 001 | −2.017E + 001 | 1.774E + 001 | 6.053E − 006 |
| 1.500E + 001 | −2.244E + 001 | 2.017E + 001 | 4.296E − 006 |
| 1.750E + 001 | −2.513E + 001 | 2.344E + 001 | 6.444E − 006 |
| 2.000E + 001 | −2.819E + 001 | 2.950E + 001 | 3.583E − 005 |
| 2.250E + 001 | −3.128E + 001 | 4.325E + 001 | 3.183E − 005 |
| 2.500E + 001 | −3.390E + 001 | 6.688E + 001 | 1.630E − 005 |
| 2.750E + 001 | −3.587E + 001 | 8.439E + 001 | 1.283E − 004 |
| Z −7.000E − 001 | | | |
| 0.000E + 000 | −7.000E − 001 | −9.716E + 000 | 2.001E + 004 |
| 2.500E + 000 | −4.906E − 001 | −9.996E + 000 | 9.763E − 008 |
| 5.000E + 000 | 1.042E − 001 | −1.078E + 001 | 9.763E − 008 |
| 7.500E + 000 | 1.005E + 000 | −1.192E + 001 | 3.905E − 007 |
| 1.000E + 001 | 2.137E + 000 | −1.328E + 001 | 5.858E − 007 |
| 1.250E + 001 | 3.447E + 000 | −1.475E + 001 | 1.074E − 006 |
| 1.500E + 001 | 4.905E + 000 | −1.630E + 001 | 1.464E − 006 |
| 1.750E + 001 | 6.499E + 000 | −1.792E + 001 | 2.246E − 006 |
| 2.000E + 001 | 8.230E + 000 | −1.964E + 001 | 2.538E − 006 |
| 2.250E + 001 | 1.011E + 001 | −2.152E + 001 | 3.222E − 006 |
| 2.500E + 001 | 1.216E + 001 | −2.367E + 001 | 4.101E − 006 |
| 2.750E + 001 | 1.442E + 001 | −2.621E + 001 | 4.101E − 006 |
| Z 3.000E − 001 | | | |
| 0.000E + 000 | 3.000E − 001 | −1.104E + 001 | 1.999E + 004 |
| 2.500E + 000 | 4.848E − 001 | −1.128E + 001 | 1.954E − 007 |
| 5.000E + 000 | 1.017E + 000 | −1.197E + 001 | 1.954E − 007 |
| 7.500E + 000 | 1.839E + 000 | −1.299E + 001 | 3.907E − 007 |
| 1.000E + 001 | 2.892E + 000 | −1.424E + 001 | 7.815E − 007 |
| 1.250E + 001 | 4.131E + 000 | −1.563E + 001 | 1.075E − 006 |
| 1.500E + 001 | 5.526E + 000 | −1.711E + 001 | 1.465E − 006 |
| 1.750E + 001 | 7.066E + 000 | −1.869E + 001 | 2.149E − 006 |
| 2.000E + 001 | 8.748E + 000 | −2.040E + 001 | 2.637E − 006 |
| 2.250E + 001 | 1.058E + 001 | −2.229E + 001 | 3.321E − 006 |
| 2.500E + 001 | 1.258E + 001 | −2.449E + 001 | 4.689E − 006 |
| 2.750E + 001 | 1.480E + 001 | −2.713E + 001 | 5.275E − 006 |
| Z 6.200E + 000 | | | |
| 0.000E + 000 | 6.200E + 000 | −1.892E + 001 | 1.991E + 004 |
| 2.500E + 000 | 6.312E + 000 | −1.905E + 001 | 0.000E + 000 |
| 5.000E + 000 | 6.645E + 000 | −1.945E + 001 | 2.943E − 007 |
| 7.500E + 000 | 7.187E + 000 | −2.009E + 001 | 2.943E − 007 |
| 1.000E + 001 | 7.923E + 000 | −2.093E + 001 | 3.925E − 007 |
| 1.250E + 001 | 8.837E + 000 | −2.198E + 001 | 9.877E − 007 |
| 1.500E + 001 | 9.915E + 000 | −2.321E + 001 | 1.275E − 006 |
| 1.750E + 001 | 1.115E + 001 | −2.467E + 001 | 1.864E − 006 |
| 2.000E + 001 | 1.253E + 001 | −2.642E + 001 | 2.845E − 006 |
| 2.250E + 001 | 1.406E + 001 | −2.859E + 001 | 4.808E − 006 |
| 2.500E + 001 | 1.574E + 001 | −3.143E + 001 | 8.144E − 006 |
| 2.750E + 001 | 1.762E + 001 | −3.534E + 001 | 1.521E − 005 |
| Z 6.800E + 000 | | | |
| 0.000E + 000 | 6.800E + 000 | −1.973E + 001 | 1.989E + 004 |
| 2.500E + 000 | 6.908E + 000 | −1.986E + 001 | 9.817E − 008 |
| 5.000E + 000 | 7.230E + 000 | −2.024E + 001 | 9.817E − 008 |
| 7.500E + 000 | 7.754E + 000 | −2.086E + 001 | 2.945E − 007 |

TABLE 3-continued

| | | | |
|---|---|---|---|
| 1.000E + 001 | 8.467E + 000 | −2.169E + 001 | 5.890E − 007 |
| 1.250E + 001 | 9.356E + 000 | −2.271E + 001 | 8.835E − 007 |
| 1.500E + 001 | 1.041E + 001 | −2.393E + 001 | 1.276E − 006 |
| 1.750E + 001 | 1.161E + 001 | −2.539E + 001 | 1.963E − 006 |
| 2.000E + 001 | 1.296E + 001 | −2.716E + 001 | 2.749E − 006 |
| 2.250E + 001 | 1.446E + 001 | −2.938E + 001 | 4.418E − 006 |
| 2.500E + 001 | 1.611E + 001 | −3.234E + 001 | 8.541E − 006 |
| 2.750E + 001 | 1.794E + 001 | −3.647E + 001 | 1.669E − 005 |
| Z 1.080E + 001 | | | |
| 0.000E + 000 | 1.080E + 001 | −2.526E + 001 | 1.981E + 004 |
| 2.500E + 000 | 1.089E + 001 | −2.537E + 001 | 0.000E + 000 |
| 5.000E + 000 | 1.115E + 001 | −2.568E + 001 | 2.959E − 007 |
| 7.500E + 000 | 1.158E + 001 | −2.619E + 001 | 0.000E + 000 |
| 1.000E + 001 | 1.217E + 001 | −2.691E + 001 | 2.959E − 007 |
| 1.250E + 001 | 1.292E + 001 | −2.784E + 001 | 3.945E − 007 |
| 1.500E + 001 | 1.381E + 001 | −2.902E + 001 | 5.917E − 007 |
| 1.750E + 001 | 1.483E + 001 | −3.053E + 001 | 6.904E − 007 |
| 2.000E + 001 | 1.598E + 001 | −3.252E + 001 | 1.183E − 006 |
| 2.250E + 001 | 1.724E + 001 | −3.526E + 001 | 3.057E − 006 |
| 2.500E + 001 | 1.862E + 001 | −3.929E + 001 | 8.382E − 006 |
| 2.750E + 001 | 2.013E + 001 | −4.562E + 001 | 2.456E − 005 |
| Z 1.120E + 001 | | | |
| 0.000E + 000 | 1.120E + 001 | −2.583E + 001 | 1.979E + 004 |
| 2.500E + 000 | 1.129E + 001 | −2.593E + 001 | 2.960E − 007 |
| 5.000E + 000 | 1.154E + 001 | −2.623E + 001 | 0.000E + 000 |
| 7.500E + 000 | 1.197E + 001 | −2.674E + 001 | 1.973E − 007 |
| 1.000E + 001 | 1.255E + 001 | −2.745E + 001 | 9.867E − 008 |
| 1.250E + 001 | 1.328E + 001 | −2.837E + 001 | 9.867E − 008 |
| 1.500E + 001 | 1.415E + 001 | −2.955E + 001 | 1.973E − 007 |
| 1.750E + 001 | 1.516E + 001 | −3.107E + 001 | 1.973E − 007 |
| 2.000E + 001 | 1.629E + 001 | −3.308E + 001 | 9.867E − 007 |
| 2.250E + 001 | 1.753E + 001 | −3.589E + 001 | 2.368E − 006 |
| 2.500E + 001 | 1.888E + 001 | −4.006E + 001 | 7.992E − 006 |
| 2.750E + 001 | 2.035E + 001 | −4.668E + 001 | 2.457E − 005 |

| Solenoid with 60 gauss/cm gradient - contours | |
|---|---|
| Coil # or 0 | 1.000E + 000 |
| J (A/cm2) | 1.001E + 004 |
| a1 (cm) | 3.000E + 001 |
| a2 | 3.172E + 001 |
| b1 | −7.500E + 001 |
| b2 | 7.500E + 001 |
| precision | 5.000E + 001 |
| Coil # or 0 | 2.000E + 000 |
| J (A/cm2) | 6.000E + 003 |
| a1 (cm) | 3.300E + 001 |
| a2 | 3.700E + 001 |
| b1 | −3.200E + 001 |
| b2 | −2.800E + 001 |
| precision | 5.000E + 001 |
| Coil # or 0 | 3.000E + 000 |
| J (A/cm2) | −6.000E + 003 |
| a1 (cm) | 3.300E + 001 |
| a2 | 3.700E + 001 |
| b1 | 2.800E + 001 |
| b2 | 3.200E + 001 |
| precision | 5.000E + 001 |

| R | Z | dB/dZ | error |
|---|---|---|---|
| Z 0.000E + 000 | | | |
| 0.000E + 000 | 0.000E + 000 | −6.386E + 001 | 2.000E + 004 |
| 2.500E + 000 | 3.485E − 002 | −6.391E + 001 | 0.000E + 000 |
| 5.000E + 000 | 1.386E − 001 | −6.404E + 001 | 1.953E − 007 |
| 7.500E + 000 | 3.105E − 001 | −6.418E + 001 | 9.767E − 008 |
| 1.000E + 001 | 5.496E − 001 | −6.423E + 001 | 6.837E − 007 |
| 1.250E + 001 | 8.575E − 001 | −6.405E + 001 | 1.660E − 006 |
| 1.500E + 001 | 1.240E + 000 | −6.346E + 001 | 2.637E − 006 |
| 1.750E + 001 | 1.709E + 000 | −6.231E + 001 | 4.688E − 006 |
| 2.000E + 001 | 2.289E + 000 | −6.043E + 001 | 6.739E − 006 |
| 2.250E + 001 | 3.022E + 000 | −5.772E + 001 | 9.962E − 006 |
| 2.500E + 001 | 3.979E + 000 | −5.420E + 001 | 1.318E − 005 |
| 2.750E + 001 | 5.277E + 000 | −4.995E + 001 | 1.563E − 005 |
| Z 1.500E + 000 | | | |
| 0.000E + 000 | 1.500E + 000 | −6.583E + 001 | 1.990E + 004 |
| 2.500E + 000 | 1.534E + 000 | −6.588E + 001 | 1.963E − 007 |
| 5.000E + 000 | 1.635E + 000 | −6.600E + 001 | 9.814E − 008 |
| 7.500E + 000 | 1.804E + 000 | −6.614E + 001 | 0.000E + 000 |
| 1.000E + 001 | 2.043E + 000 | −6.621E + 001 | 5.889E − 007 |
| 1.250E + 001 | 2.355E + 000 | −6.608E + 001 | 1.668E − 006 |
| 1.500E + 001 | 2.751E + 000 | −6.563E + 001 | 3.141E − 006 |
| 1.750E + 001 | 3.246E + 000 | −6.471E + 001 | 4.711E − 006 |
| 2.000E + 001 | 3.869E + 000 | −6.319E + 001 | 7.557E − 006 |
| 2.250E + 001 | 4.668E + 000 | −6.101E + 001 | 1.138E − 005 |
| 2.500E + 001 | 5.718E + 000 | −5.817E + 001 | 1.570E − 005 |
| 2.750E + 001 | 7.140E + 000 | −5.473E + 001 | 1.914E − 005 |
| 3.000E + 000 | | | |
| 0.000E + 000 | 3.000E + 000 | −6.780E + 001 | 1.980E + 004 |
| 2.500E + 000 | 3.033E + 000 | −6.785E + 001 | 9.864E − 008 |
| 5.000E + 000 | 3.132E + 000 | −6.798E + 001 | 1.973E − 007 |
| 7.500E + 000 | 3.298E + 000 | −6.816E + 001 | 1.973E − 007 |
| 1.000E + 001 | 3.535E + 000 | −6.831E + 001 | 5.918E − 007 |
| 1.250E + 001 | 3.849E + 000 | −6.833E + 001 | 1.578E − 006 |
| 1.500E + 001 | 4.253E + 000 | −6.811E + 001 | 2.861E − 006 |
| 1.750E + 001 | 4.766E + 000 | −6.753E + 001 | 4.932E − 006 |
| 2.000E + 001 | 5.421E + 000 | −6.651E + 001 | 8.286E − 006 |
| 2.250E + 001 | 6.266E + 000 | −6.500E + 001 | 1.282E − 005 |
| 2.500E + 001 | 7.379E + 000 | −6.301E + 001 | 1.884E − 005 |
| 2.750E + 001 | 8.881E + 000 | −6.056E + 001 | 2.407E − 005 |

The affect of Z1 and Z2 gradients can be seen from FIG. 3 which illustrates plots obtained by computer simulation of contours defining a field variation of ±100ppm relative to the center of the region. FIGS. 3A-3E relate to a Z1 component with a homogeneity of 500 ppm at a 25 cm radius with Z2 varying from 100 to 500 ppm in steps of 100 ppm starting at 100 pp, at 3A. FIGS. 3F-3J were obtained for a component with a homogeneity Z1 of 1000 ppm and Z2 varying from 200 ppm to 1000 ppm in 200 ppm steps starting at 200 ppm for 3F.

The dark plot indicates positive distortion and the light plot negative distortion.

It can be seen that an increase in the Z2 component causes an increased dishing of the homogeneous region while an increase in the Z1 gradient causes the region to narrow.

Figure 4:
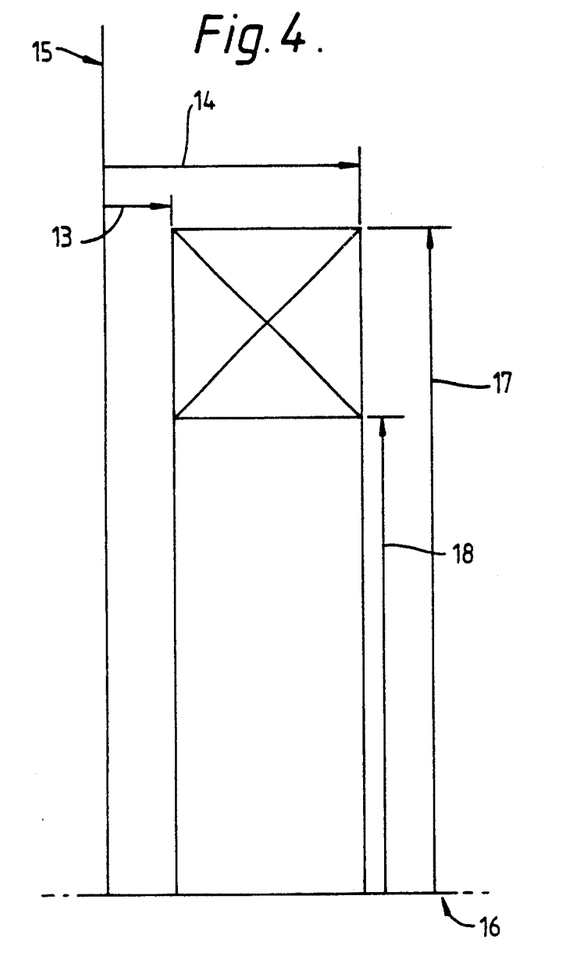
FIG. 4 illustrates the coil dimensions referred to in Table 4.
Figure 5:
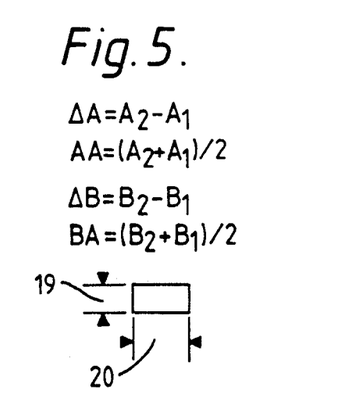
FIG. 5 shows a cross section through the conductor of the coil of FIG. 4.

An example of a coil configuration suitable for this invention is set out in Table 4 below. The dimensions quoted are illustrated in FIG. 4. FIG. 5 is a cross section through the conductor. The reference numerals in FIGS. 4 and 5 refer to dimensions shown in the table as follows. $B_1$; 13; $B_2$, 14; midplane 15; centre line 16; $A_1$; 18; $A_2$; 17; $\delta_r$; 19; $\delta_z$, 20.

$$\Delta A = (A_2 - A_1)/2$$

$$\gamma B = B_2 - B_1$$

$$BA = (B_2 + B_1)/2$$

The system of Table 4 is effectively a combined dipole (coils 1 and 2) and quadrupole (coils 3-5).

The dipole is essentially a solenoid (coil 1) with correcting pair (coil 2). This system produces Z0 = 48.5 Gauss/Amp = 2 Tesla at 412.33 Amps
Z2 = 41 ppm on 25 cm radius
Z4 = 26 ppm
Z6 = −105 ppm
Z8 = −15 ppm
Z10, Z12 are <|1| ppm The quadrupole is essentially a "z gradient" coil set, outside the dispole. The field harmonics are Z1 = 0.4144 Gauss/Amp on 25 cm radius = ±100 ppm of 2T in 5.6 mm $\delta z$
Z3 = −1 ppm
Z5 = −5 ppm
Z7 = −10 ppm
Z9 = −1.5 ppm
Z11 = −1.4 ppm

TABLE 4

| Coil No | A1 cm | A2 cm | ΔA cm | AA cm | Sr mm | LAYERS | B1 cm | B2 cm | ΔB cm | BA cm | Sz mm | Turn/LAYER | TD TURN/cm³ | TURN | WDG LENGTH m |
|---|---|---|---|---|---|---|---|---|---|---|---|---|---|---|---|
| 1 | 42 | 43.896 | 1.896 | 42.948 | 1.58 | 12 | −100 | 100 | 200 | 0 | 2.96 | | 21.382 | 8108 | 21880 |
| 2 | 44.706 | 45.97 | 1.264 | 45.338 | 1.58 | 8 | 62.7457 | 76.5687 | 13.82 | 69.6557 | 2.96 | | 21.382 | 374 × 2 | 2128 |
| 3 | 50.5 | 50.816 | 0.316 | 50.658 | 1.58 | 2 | 61.56 | 70.44 | 8.88 | 66 | 2.96 | | 21.382 | ±60 × 2 | 382 |
| 4 | 50.5 | 50.816 | 0.316 | 50.658 | 1.58 | 2 | 40.964 | 43.036 | 2.072 | 42 | 2.96 | | 21.382 | ±14 × 2 | 89 |
| 5 | 50.5 | 50.816 | 0.316 | 50.658 | 1.58 | 2 | 17.556 | 18.444 | 0.888 | 18 | 2.96 | | 21.382 | ±6 × 2 | 38 |

We claim:

1. A magnetic field generating apparatus, comprising:
a solenoid having a plurality of turns about an axis;
a center plane defined orthogonal to said axis and passing through said axis midway between ends of said solenoid; and
a plurality of coaxial coils spaced apart and along said axis, said coils being positioned relative to each other and to said solenoid such that when working currents flow through said coils and said solenoid a magnetic field is generated within said solenoid, said magnetic field having a zero order component and a first order gradient with high order gradients being substantially balanced, wherein said magnetic field has contours of constant value extending with a radially outward component from said axis of aid solenoid, and wherein regions of substantially homogeneous magnetic field for performing an NMR experiment are formed about said contours, said regions extending along said contours and having a substantially constant thickness on either side of said contours.

2. The magnetic field generating apparatus as claimed in claim 1, wherein said magnetic field generated by said solenoid and said coils further includes a second order gradient, said first order gradient being at least equal to said second order gradient.

3. The magnetic field generating apparatus as claimed in claim 1, wherein said coils are positioned radially outwardly from said solenoid.

* * * * *